United States Patent
Youn et al.

(10) Patent No.: US 9,257,610 B2
(45) Date of Patent: Feb. 9, 2016

(54) LIGHT EMITTING DIODE AND MANUFACTURING METHOD THEREOF

(71) Applicant: ELECTRONICS AND TELECOMMUNICATIONS RESEARCH INSTITUTE, Daejeon (KR)

(72) Inventors: Doo Hyeb Youn, Daejeon (KR); Young-Jun Yu, Daejeon (KR); Kwang Hyo Chung, Daejeon (KR); Choon Gi Choi, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/290,192

(22) Filed: May 29, 2014

(65) Prior Publication Data
US 2014/0367731 A1  Dec. 18, 2014

(30) Foreign Application Priority Data
Jun. 17, 2013  (KR) ........................ 10-2013-0069249

(51) Int. Cl.
*H01L 21/00*  (2006.01)
*H01L 33/00*  (2010.01)
*H01L 33/42*  (2010.01)
*H01L 33/32*  (2010.01)
*H01L 33/38*  (2010.01)

(52) U.S. Cl.
CPC .................. *H01L 33/42* (2013.01); *H01L 33/32* (2013.01); *H01L 33/38* (2013.01); *H01L 2933/0016* (2013.01)

(58) Field of Classification Search
CPC ........ H01L 33/06; H01L 33/325; H01L 33/10; H01L 2933/0016; H01L 29/1606; H01L 29/6603; H01L 33/18; H01L 33/42; H01L 33/32; H01L 33/38
See application file for complete search history.

(56) References Cited

U.S. PATENT DOCUMENTS

| 8,211,352 B2 | 7/2012 | Baca et al. |
| 8,519,045 B2 | 8/2013 | Jang et al. |
| 2015/0171262 A1* | 6/2015 | Kim .................. H01L 33/32 257/13 |

FOREIGN PATENT DOCUMENTS

| KR | 10-1025571 | 3/2010 |
| KR | 10-2010-0099586 | 9/2010 |

(Continued)

OTHER PUBLICATIONS

Chaoying Wan et al., "Poly (ε-caprolactone) / graphene oxide biocomposites: mechanical properties and bioactivity", Biomedical Materials, 6 (2011), pp. 1-8.

(Continued)

*Primary Examiner* — Su C Kim
*Assistant Examiner* — Junaiden Mirsalahuddin
(74) *Attorney, Agent, or Firm* — Kile Park Reed & Houtteman PLLC

(57) ABSTRACT

A light emitting diode includes: a substrate; an n-type semiconductor layer disposed on the substrate; an active layer disposed on the n-type semiconductor layer; a p-type semiconductor layer disposed on the active layer; a first electrode disposed on the p-type semiconductor layer and made of a metal oxide; a second electrode disposed on the first electrode and made of graphene; a p-type electrode disposed on the second electrode; and an n-type electrode disposed on the n-type semiconductor layer, wherein a work function of the first electrode is less than a work function of the p-type semiconductor layer, but is greater than a work function of the second electrode.

5 Claims, 17 Drawing Sheets

(56) References Cited

FOREIGN PATENT DOCUMENTS

| | | |
|---|---|---|
| KR | 10-2011-0055893 | 5/2011 |
| KR | 10-2012-0091792 | 8/2012 |

OTHER PUBLICATIONS

Keun-Young Shin et al., "Micropatterning of Graphene Sheets by Inkjet Printing and Its Wideband Dipole-Antenna Application", Advanced Materials, 2011, 23, pp. 2113-2118.

* cited by examiner

LIGHT EMITTING DIODE AND MANUFACTURING METHOD THEREOF

CROSS-REFERENCE TO RELATED APPLICATION

This application claims priority to and the benefit of Korean Patent Application No. 10-2013-0069249 filed in the Korean Intellectual Property Office on Jun. 17, 2013, the entire contents of which are incorporated herein by reference.

BACKGROUND OF THE INVENTION (a) Field of the Invention

The present invention relates to a light emitting diode (hereinafter, referred to as "LED") and a manufacturing method thereof. More particularly, the present invention relates to a high luminance LED including a transparent graphene electrode layer.

(b) Description of the Related Art

An LED or a laser diode (hereinafter referred to as "ID") using groups III-V nitride semiconductor materials has been extensively used in a light-emitting device to obtain light having a blue or green wavelength band.

Gallium nitride (GaN) among Group III-V nitride semiconductors is gaining the spotlight as a core material of light emitting devices such as an LED, an LD, etc. due to its excellent physical and chemical properties.

The light emitting device includes a substrate for growing a semiconductor material with GaN, an n-type nitride semiconductor layer, a chemical layer, and a p-type nitride semiconductor layer sequentially laminated on the substrate, and electrodes formed on the n-type nitride semiconductor layer and the p-type nitride semiconductor layer, respectively.

In this case, a transparent electrode is formed by a material such as indium tin oxide (ITO) on a p-type nitride semiconductor layer and then an electrode is formed to increase a current injection area and to form an ohmic contact.

SUMMARY OF THE INVENTION

The present invention has been made in an effort to provide an LED and a manufacturing method thereof having advantages of improving transmission efficiency through the entire region of an ultraviolet ray region and an infrared ray region as compared with an oxide semiconductor transparent electrode of the related art.

However, in a case of the transparent electrode such as ITO, when the wavelength of the LED is in the UV band (300-400 nm), transmission efficiency is significantly deteriorated to 40% or less. In a case of a visible light region (450-750 nm), the transmission efficiency is also degraded in a green region (500~550 nm).

An exemplary embodiment of the present invention provides a light emitting diode including: a substrate; an n-type semiconductor layer disposed on the substrate; an active layer disposed on the n-type semiconductor layer; a p-type semiconductor layer disposed on the active layer; a first electrode disposed on the p-type semiconductor layer and made of a metal oxide; a second electrode disposed on the first electrode and made of graphene; a p-type electrode disposed on the second electrode; and an n-type electrode disposed on the n-type semiconductor layer, wherein a work function of the first electrode is less than a work function of the p-type semiconductor layer, but is greater than a work function of the second electrode.

The first electrode may have a net structure.

The first electrode may include: a plurality of first conductive patterns having a circle shape or a polygon shape and arranged in a matrix; a plurality of second conductive patterns protruding from the first conductive patterns to connect adjacent first conductive patterns to each other; and a plurality of third conductive patterns protruding in a direction perpendicular to the second conductive patterns from the first conductive patterns to connect adjacent first conductive patterns to each other, wherein the second conductive patterns and the third conductive patterns are linear. DeletedTexts The first electrode may have a line width in a range of 10 nm to 100 nm.

The first electrode may include at least one of ITO, ZnO, $SnO_2$, $TiO_2$, $SbO_2$, NiO, CrO, and CuO.

Another embodiment of the present invention provides, a method of manufacturing a light emitting diode, including: forming an n-type semiconductor layer on a substrate; forming an active layer on the n-type semiconductor layer; forming a p-type semiconductor layer on the active layer; forming a first electrode by electrospinning after disposing a mask on the p-type semiconductor layer; forming a second electrode made of graphene on the first electrode after moving the mask; forming a p-type electrode on the second electrode; and forming an n-type electrode on the n-type semiconductor layer.

The forming of the first electrode may include: disposing a first mask having a first linear opening pattern; forming a first conductive pattern of the first electrode by injecting a spinning solution into the first opening pattern; disposing a second mask having a second linear opening pattern above the first opening pattern; and forming a second conductive pattern of the first electrode by injecting the spinning solution into the second opening pattern, wherein the second opening pattern and the first opening pattern are disposed to cross each other.

The spinning solution may have a viscosity in a range of 10 cps to 50 cps.

The spinning solution may include a metal salt such as copper acetate monohydrate (($CH_3COO)_2Cu$), titanium tetraisopropoxide ($Ti(OCH(CH_3)_2)_4$), tin isopropoxide ($Sn(OCH(CH_3)_2)_4$), and antimony isopropoxide ($C_9H_{21}O_3Sb$) including metal particles such as zinc (Zn), phosphorus (P), titanium (Ti), tin (Sn), copper (Cu) and antimony (Sb); and a solvent having a viscosity in a range of 10 cps to 50 cps.

The solvent may include at least one of diethylene glycol, terpineol, ethylene glycol, diethylene glycol monobenzyl ether, propylene glycol monophenyl ether, glycerol, propylene glycol, and triethylene glycol.

Yet another embodiment of the present invention provides a method of manufacturing a light emitting diode, including: forming an n-type semiconductor layer on a substrate; forming an active layer on the n-type semiconductor layer; forming a p-type semiconductor layer on the active layer; disposing an electric field induced pattern under the substrate; forming a first electrode made of a metal oxide on the p-type semiconductor layer by electrospinning; removing the electric field induced pattern and forming a second electrode made of graphene on the first electrode; forming a p-type electrode on the second electrode; and forming an n-type electrode on the n-type semiconductor layer.

The electric field induced pattern and the first electrode may include a net structure.

The first electrode may be formed by a spinning solution having a viscosity in a range of 10 cPs to 50 cPs.

DETAILED DESCRIPTION OF THE EMBODIMENTS

Figure 1:
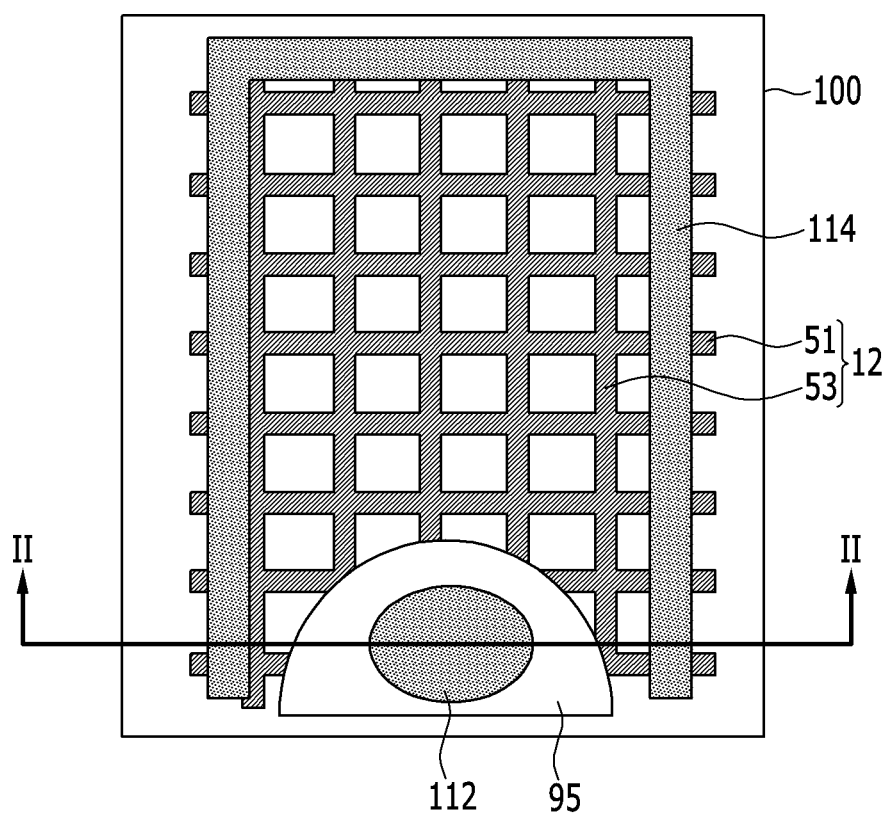
FIG. 1 is a top plan view illustrating an LED according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, the LED according to an exemplary embodiment of the present invention will be described in detail with reference to the accompanying drawings.

Figure 2:
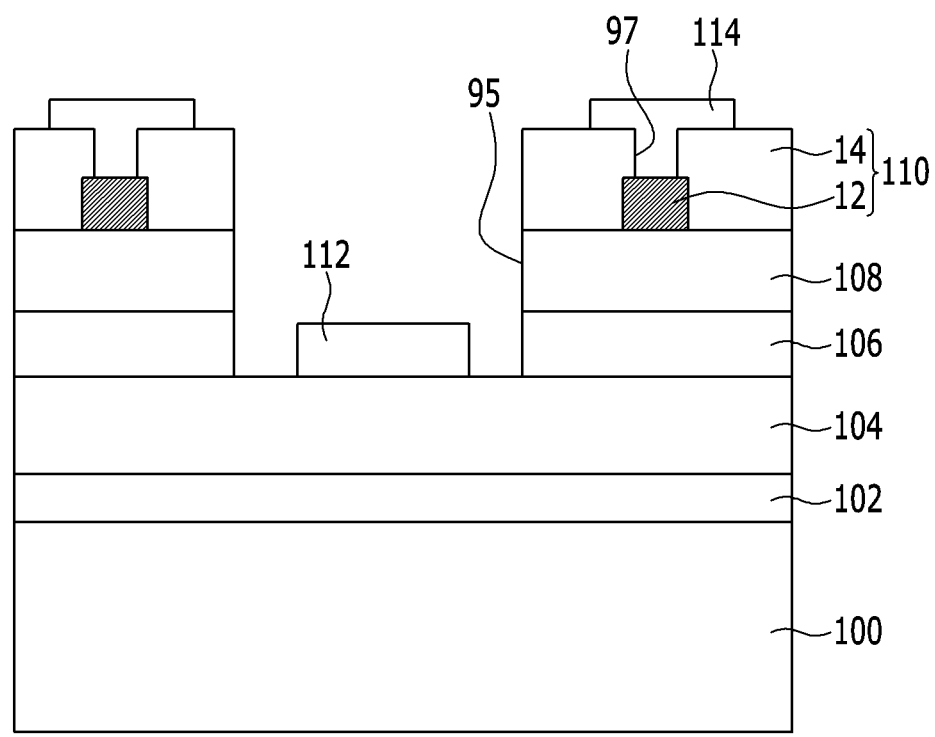
FIG. 2 is a cross-sectional view taken along line II-II of FIG. 1.
Figure 3:
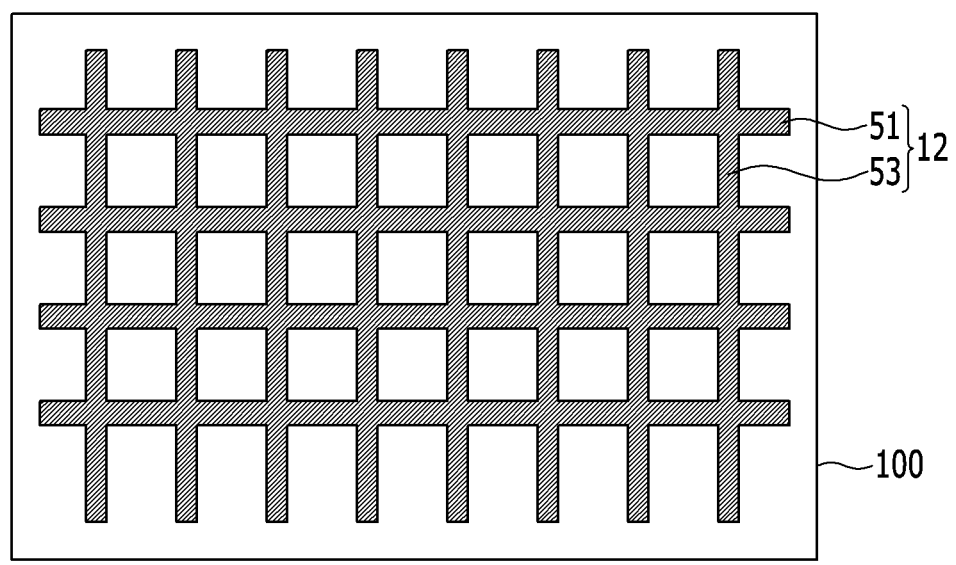
FIG. 3 is a top plan view illustrating a first electrode of the LED shown in FIG. 1.
Figure 4:
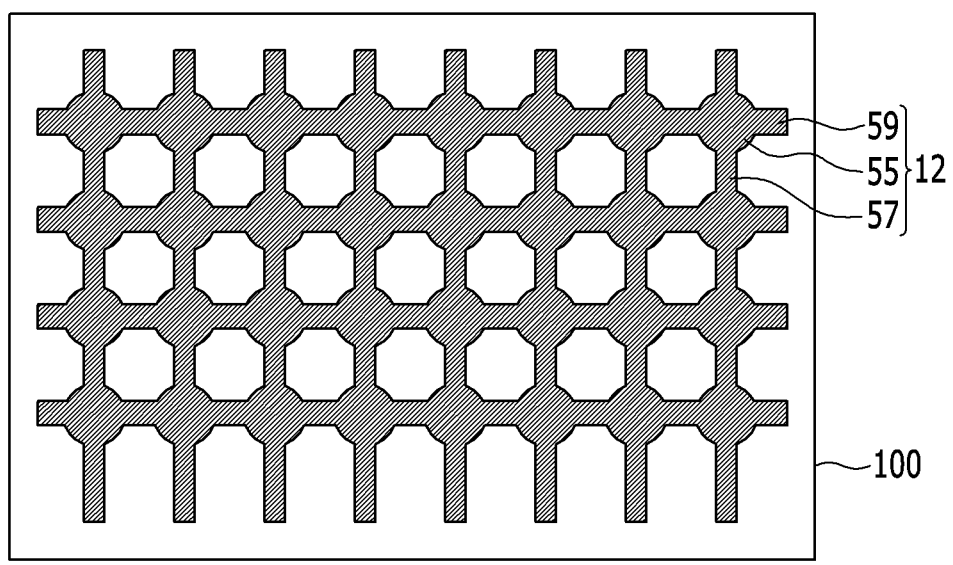
FIGS. 4 and 5 are top plan views illustrating a first electrode according to another exemplary embodiment of the present invention.
Figure 5:
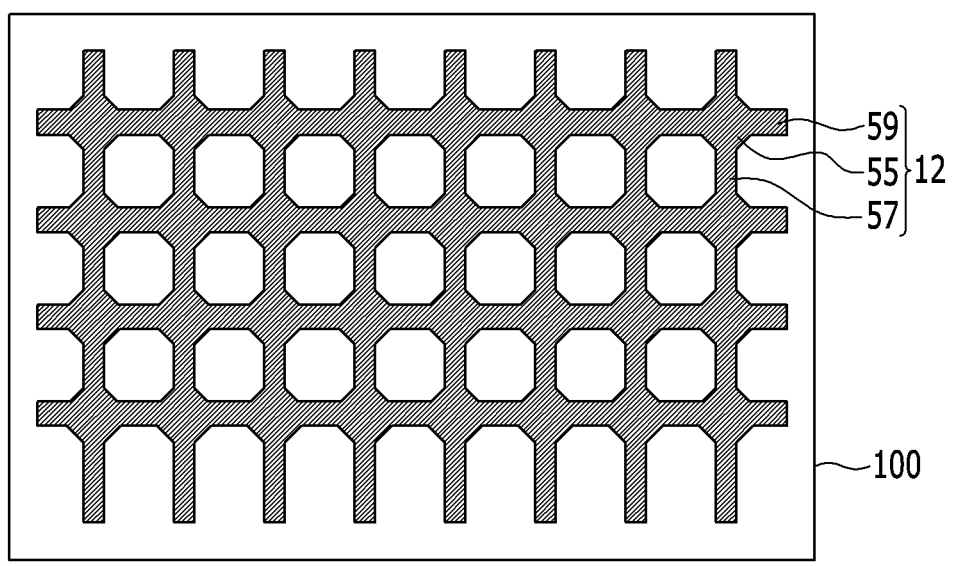

FIG. 1 is a top plan view illustrating an LED according to an exemplary embodiment of the present invention, FIG. 2 is a cross-sectional view taken along line II-II of FIG. 1, FIG. 3 is a top plan view illustrating a first electrode of the LED shown in FIG. 1, and FIGS. 4 and 5 are top plan views illustrating a first electrode according to another exemplary embodiment of the present invention.

As shown in FIGS. 1 and 2, the LED according to an exemplary embodiment of the present invention includes a substrate 100, a buffer layer 102 formed on the substrate 100, an n-type semiconductor layer 104 disposed on the buffer layer 102, an active layer 106 disposed on the n-type semiconductor layer 104, a p-type semiconductor layer 108 disposed on the active layer 106, a transparent electrode 110 disposed on the p-type semiconductor layer 108, an n-type electrode 112 disposed on the n-type semiconductor layer 104, and a p-type electrode 114 disposed on the transparent electrode 110.

The substrate 100 may include a sapphire substrate on which a GaN semiconductor is easily grown.

The buffer layer 102 is made of GaN which is undoped with conductive impurities, and is formed to reduce the differences in lattice constants and thermal expansion coefficients between the substrate 100 and a semiconductor layer.

The n-type semiconductor layer 104, the active layer 106, and the p-type semiconductor layer 108 may include a semiconductor material having a compositional formula of $In_xAl_yGa_{(1-x-y)}N$ ($0 \leq x \leq 1$, $0 \leq y \leq 1$, and $0 \leq x+y \leq 1$). The n-type semiconductor layer may include a GaN layer or a GaN/AlGaN layer doped with an n-type conductive impurity, and the p-type semiconductor layer may include a GaN layer or a GaN/AlGaN layer doped with a p-type conductive impurity.

Further, the active layer 106 may include a GaN/InGaN layer having a multi quantum well (MQW) structure.

The transparent electrode 110 includes a first electrode 12 and a second electrode 14 disposed on the first electrode 12.

Sheet resistance of the transparent electrode 110 is 100 $\Omega/cm^2$ or less, and the transparent electrode 110 has light transmittance of 80% or greater. The transparent electrode 110 may have a thickness in the range of 100 nm to 500 nm, and may represent resistivity of $1 \times 10^{-3}$ $\Omega \cdot cm$.

The first electrode 12 may be made of a metal oxide which has a lower work function than that of the p-type semiconductor 108 and has a greater work function than that of a graphene electrode, and may be made of at least one of ITO, ZnO, $SnO_2$, $TiO_2$, $SbO_2$, NiO, CrO, and CuO. The first electrode 12 reduces contact resistance between the p-type semiconductor 108 and the second electrode 14 by lowering a Shottky barrier height (SBH).

In this case, the first electrode 12 may have a net structure with a line width D in the range of 10 nm to 100 nm as shown in FIG. 3. In the net structure, a plurality of first conductive patterns 51 may cross a plurality of second conductive patterns 53, and both of the first conductive patterns 51 and the second conductive patterns 53 are linear.

Further, as shown in FIGS. 4 and 5, the first electrode 12 includes a plurality of third conductive patterns 55 having a circle shape or a polygon shape, a plurality of fourth conductive patterns 57 protruding from the third conductive patterns 55 to connect adjacent third conductive patterns 55 to each other, and a plurality of fifth conductive patterns 59 protruding in a direction perpendicular to the fourth conductive patterns 57 from the third conductive patterns 55 to connect adjacent third conductive patterns 55 to each other.

In this case, the fourth conductive patterns 57 and the fifth conductive patterns 59 may be linear.

Referring back to FIGS. 1 and 2, the second electrode 14 may be made of graphene. The graphene may include a single layer or a plurality of layers of covalently bonded carbon atoms. In this case, the covalently bonded carbon atoms of each layer may form a six-member ring as a repeating unit, and may further include a five-member ring or a seven-member ring.

The p-type electrode 114 and the n-type electrode 112 may be made of nickel (Ni) or copper (Cu).

Hereinafter, a method of manufacturing the LED according to an exemplary embodiment of the present invention will be described with reference to FIGS. 6 to 9 and FIG. 2 described above.

Figure 6:
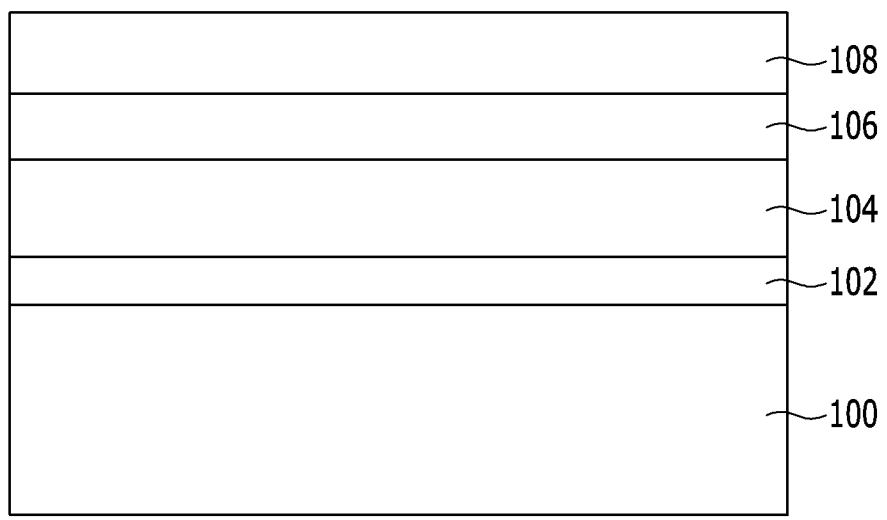
FIG. 6 is a cross-sectional view illustrating a middle step in a method of manufacturing the LED according to an exemplary embodiment of the present invention.
Figure 7:
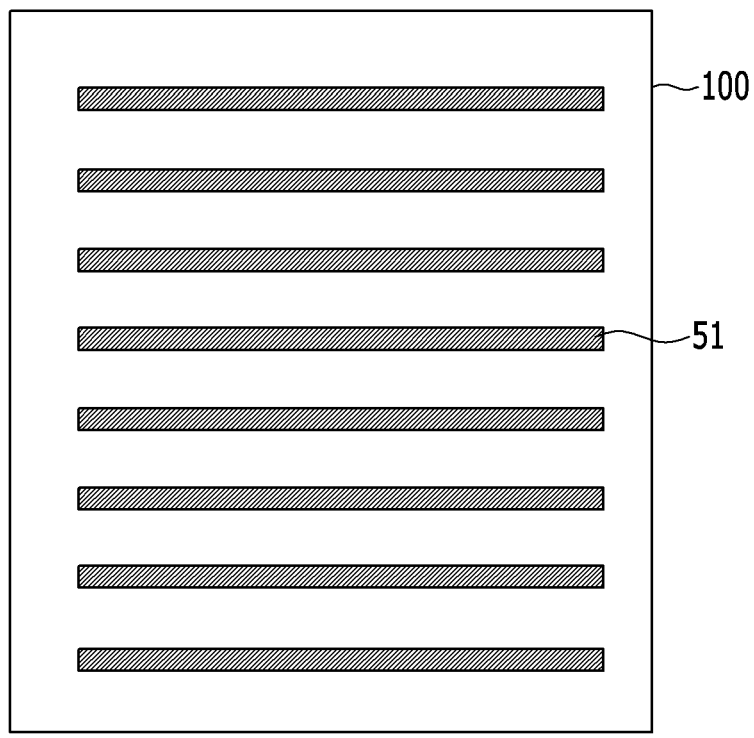
FIG. 7 is a top plan view illustrating an electrode in a middle step of a method of manufacturing the LED according to an exemplary embodiment of the present invention.
Figure 8:
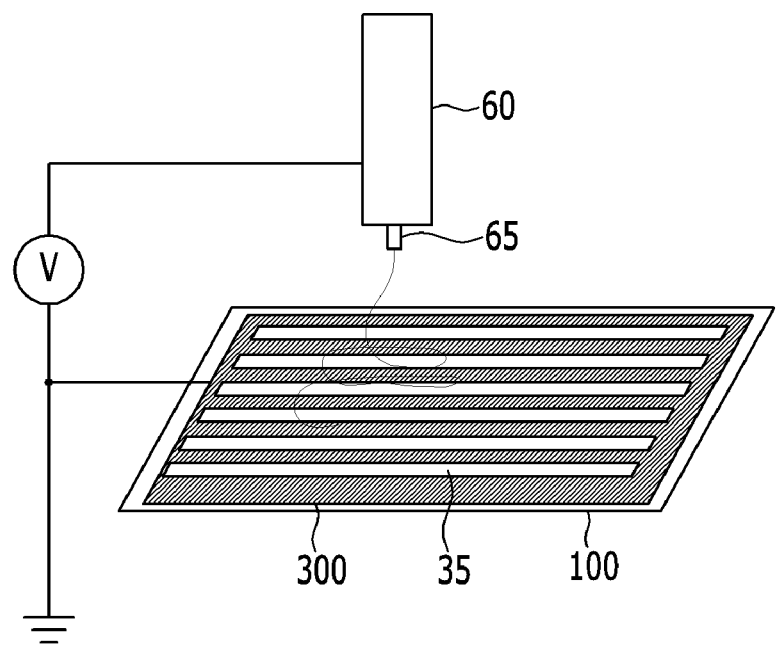
FIG. 8 is a view schematically illustrating an electrospinning device according to an exemplary embodiment of the present invention.
Figure 9:
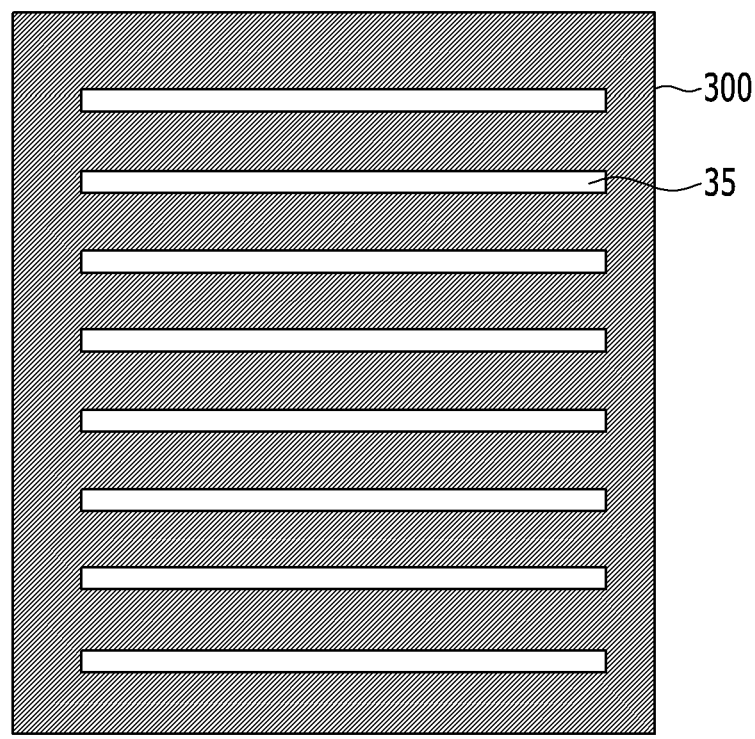
FIG. 9 is a top plan view illustrating a first mask for manufacturing the LED according to an exemplary embodiment of the present invention.
Figure 10:
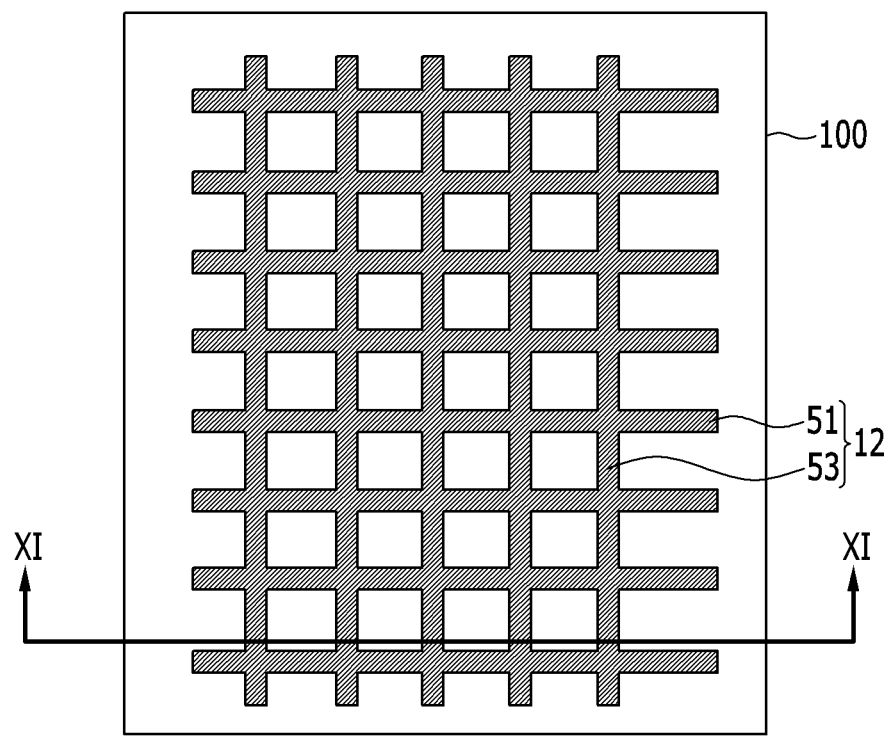
FIGS. 10, 13, and 15 are cross-sectional views illustrating a middle step in a method of manufacturing the LED according to an exemplary embodiment of the present invention.
Figure 11:
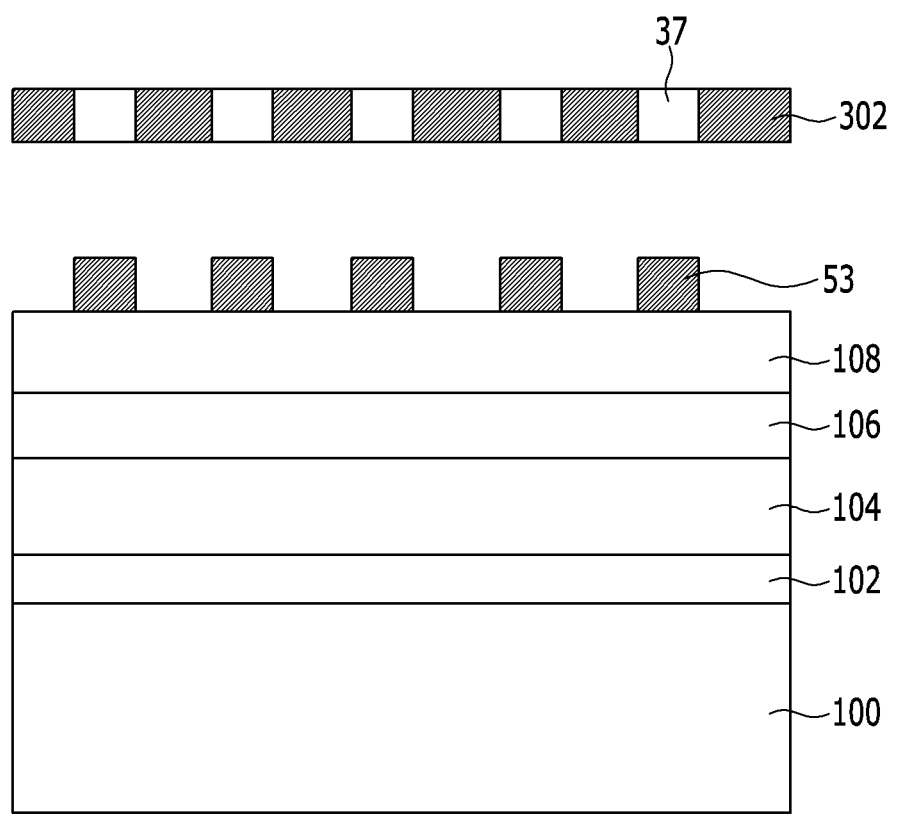
FIGS. 11 and 12 are cross-sectional views taken along line XI-XI of FIG. 10.
Figure 12:
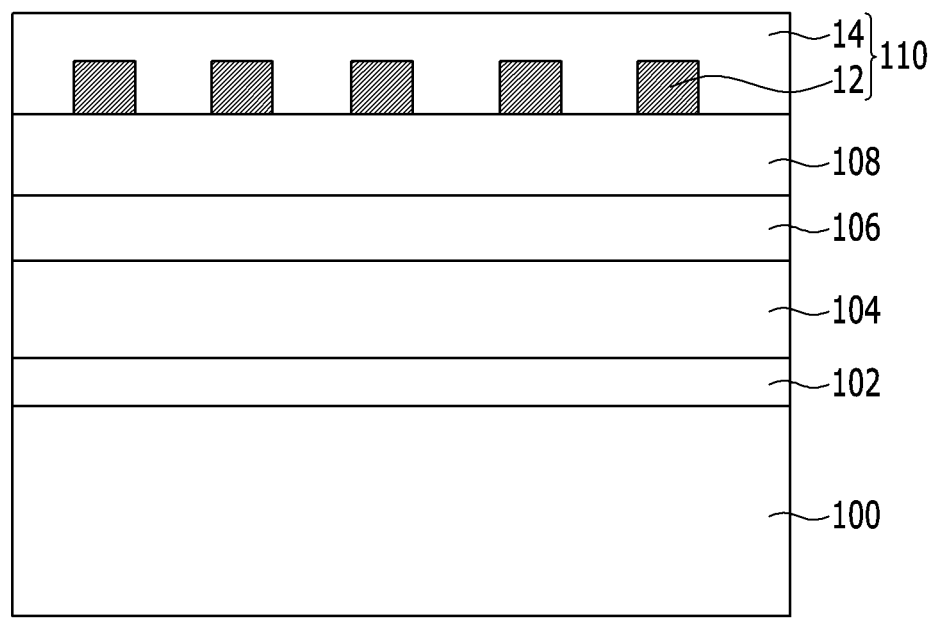
Figure 13:
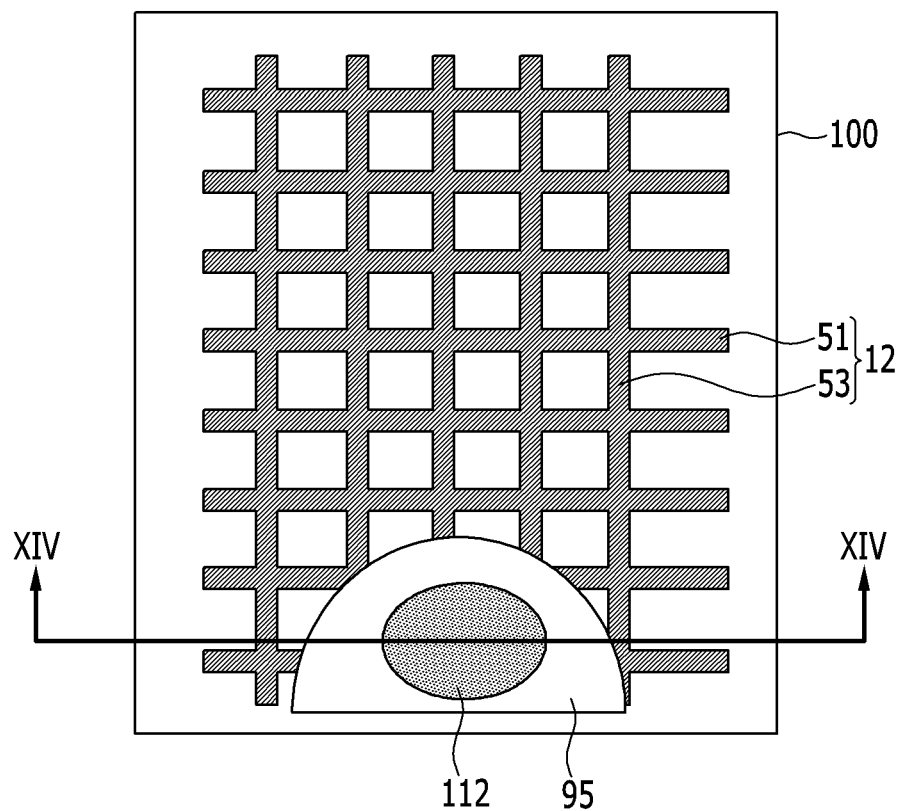
Figure 14:
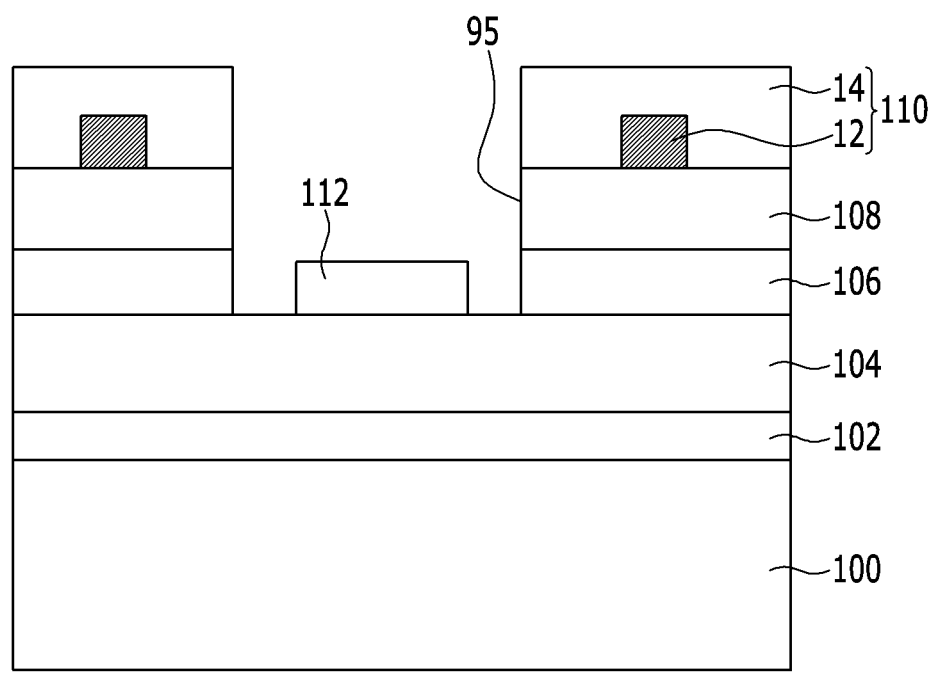
FIG. 14 is a cross-sectional view taken along line XIV-XIV of FIG. 13.
Figure 15:
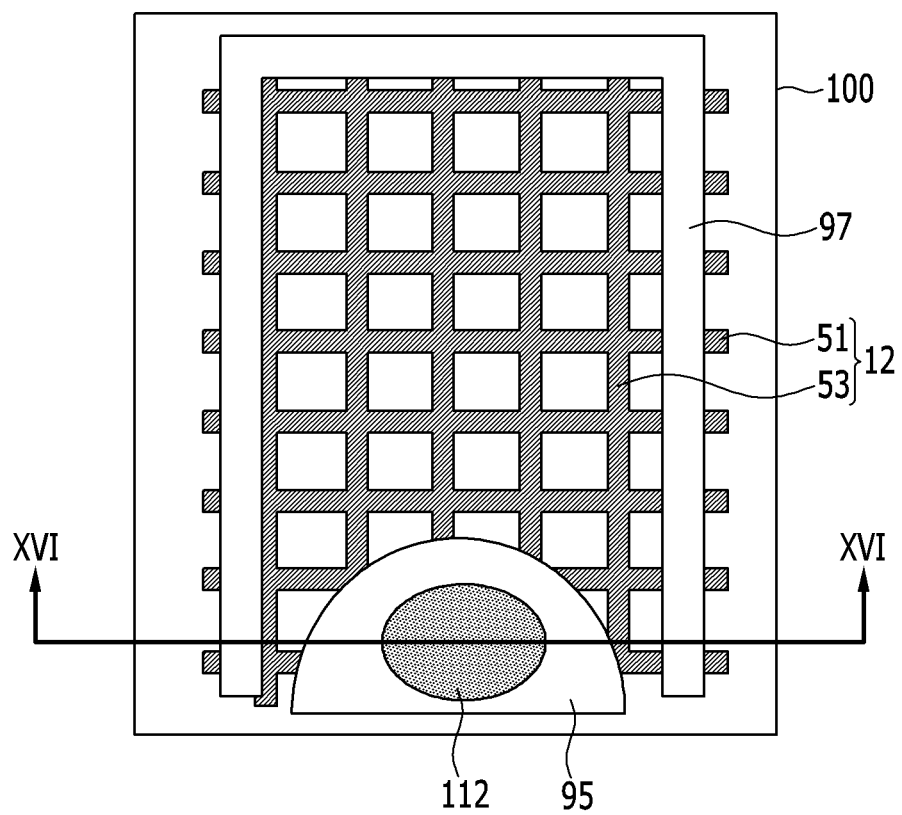
Figure 16:
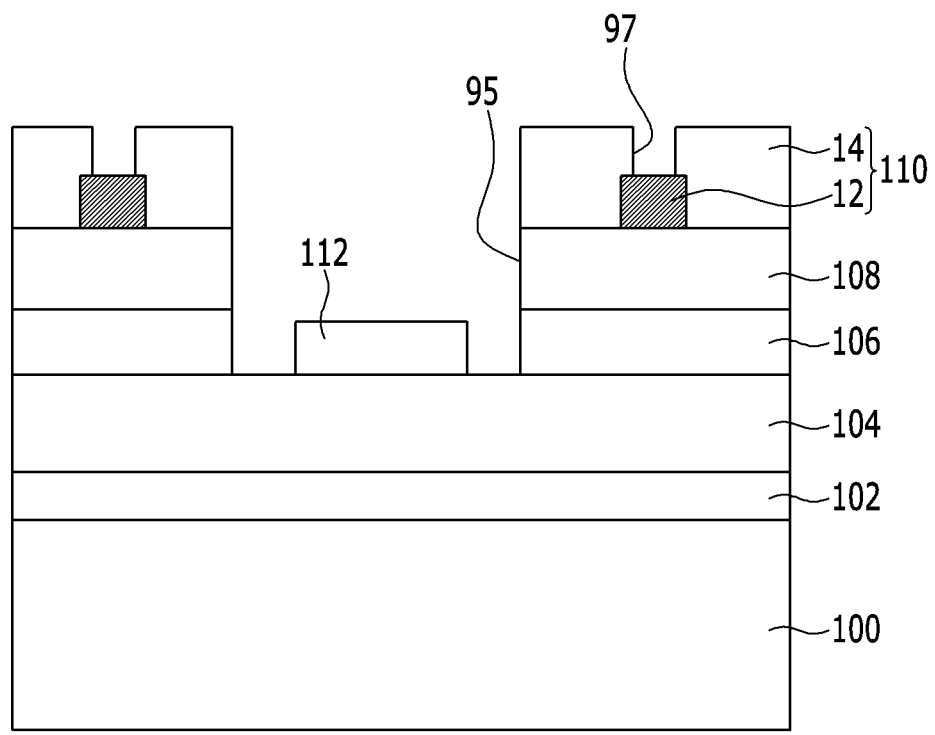
FIG. 16 is a cross-sectional view taken along line XVI-XVI of FIG. 15.

FIG. 6 is a cross-sectional view illustrating a middle step in a method of manufacturing the LED according to an exemplary embodiment of the present invention, FIG. 7 is a top plan view illustrating an electrode in a middle step of a method of manufacturing the LED according to an exemplary embodiment of the present invention, FIG. 8 is a view schematically illustrating an electrospinning device according to an exemplary embodiment of the present invention, FIG. 9 is a top plan view illustrating a first mask for manufacturing the LED according to an exemplary embodiment of the present invention, FIGS. 10, 13, and 15 are cross-sectional views illustrating a middle step in a method of manufacturing the LED according to an exemplary embodiment of the present invention, FIGS. 11 and 12 are cross-sectional views taken along line XI-XI of FIG. 10, FIG. 14 is a cross-sectional view taken along line XIV-XIV of FIG. 13, and FIG. 16 is a cross-sectional view taken along line XVI-XVI of FIG. 15.

First, as shown in FIG. 6, the buffer layer 102, the n-type semiconductor layer 104, the active layer 106, and the p-type semiconductor layer 108 are sequentially formed on the substrate 100.

The n-type semiconductor layer 104, the p-type semiconductor layer 108, and the active layer 106 may be formed by a process such as metal organic chemical vapor deposition (MOCVD), liquid phase epitaxy, hydride vapor phase epitaxy, and molecular beam epitaxy.

As shown in FIG. 7, after a first mask 300 is disposed on the p-type semiconductor layer 108, the first conductive pattern 51 is formed by electrospinning, and then a heat treatment is performed in a vacuum chamber at 500° C. for 90 minutes so that remaining solvent is removed. The first mask 300 includes a plurality of linear openings 35 which are spaced apart from each other in one direction as shown in FIG. 9.

In the electrospinning, as shown in FIG. 8, a polymer solution or a polymer melt stored in a reservoir 60 located above a ground corrector is dispensed through a nozzle 65 by an electrostatic force due to a high voltage of greater than several hundred to several thousand volts, and is moved onto a p-type semiconductor (not shown) of the substrate 100 in a ground state so that a pattern is formed.

In this case, the nozzle 65 is made of metal, and has a diameter in the range of 5 μm to 200 μm. A spinning solution has a viscosity in the range of 10 cps to 50 cps, and the spinning solution may be exhausted at a speed of nl/min to ul/min.

The spinning solution may be prepared by mixing a metal salt such as copper acetate monohydrate (($CH_3COO)_2Cu$), titanium tetraisopropoxide ($Ti(OCH(CH_3)_2)_4$), tin isopropoxide ($Sn(OCH(CH_3)_2)_4$), and antimony isopropoxide ($C_9H_{21}O_3Sb$) including metal particles such as zinc (Zn), phosphorus (P), titanium (Ti), tin (Sn), copper (Cu) and antimony (Sb) with a solvent having a viscosity in the range of 10 cps to 50 cps.

The solvent may include at least one of diethylene glycol, terpineol, ethylene glycol, diethylene glycol monobenzyl ether, propylene glycol monophenyl ether, glycerol, propylene glycol, and triethylene glycol.

Next, as shown in FIGS. 10 and 11, after the first mask 300 is removed, a second mask 302 is disposed above the first conductive pattern 51 and then the second conductive pattern 53 is formed. The second conductive pattern 53 is formed in a direction crossing the first conductive pattern 51.

The second mask 302 includes a plurality of linear openings 37, and the linear openings 37 are formed in a direction crossing the first conductive pattern 51. The second conductive pattern 53 may be formed in the same manner as in the first conductive pattern 51.

In this manner, if the first electrode 12 with the first conductive pattern 51 and the second conductive pattern 53 is formed by the electro-spinning, a photolithography process for forming the first electrode 12 is not performed so that process time can be reduced.

Next, as shown in FIG. 12, after removal of the second mask 302, the second electrode 14 is formed on the first electrode 12.

The second electrode 14 may be formed by transferring using a transfer substrate including the graphene. In detail, a catalyst layer is formed on a silicon on insulator (SOI) substrate on which a silicon oxide layer is formed using an electron beam irradiation device. In this case, the catalyst layer may be made of a transition metal such as nickel (Ni), copper (Cu), and platinum (Pt) capable of easily absorbing carbon. The catalyst layer has a thickness of approximately 200 nm.

Further, a carbon layer is formed by performing heat treatment with respect to the substrate 100 on which the catalyst layer is formed. In this case, the heat treatment is performed by putting the substrate 100 in a thermal chemical vapor deposition (T-CVD) device or a rapid thermal chemical vapor deposition (RT-CVD) device to maintain a high temperature of greater than 1000° C., and by injecting a mixed gas of $CH_4$, $H_2$, and Ar into the deposition device.

After that, the graphene is grown on a surface of the catalyst layer by separating carbon combined with the catalyst layer through rapid cooling, and a transfer substrate made of polydimethylsiloxane (PDMS) or poly(methylmethacrylate) (PMMA) is formed on the graphene. Thereafter, the catalyst layer is removed.

Next, the graphene is transferred onto the first electrode 12 using the transfer substrate, and then the second electrode made of the graphene is formed by removing the transfer substrate using acetone.

Next, as shown in FIGS. 13 and 14, after a first shadow mask (not shown) is disposed, a first opening 95 exposing the n-type semiconductor is formed by dry etching, and then an n-type electrode 112 making contact with the n-type semiconductor is formed in the first opening 95. The n-type electrode 112 may be formed by depositing one of copper (Cu), nickel (Ni), chromium (Cr), gold (Au), and TiAu in the vacuum chamber.

Next, as shown in FIGS. 15 and 16, after the second shadow mask (not shown) is disposed, and an upper graphene layer is etched using inductively coupled plasma (ICP) equipment by injecting chlorine ($Cl_2$) gas into the vacuum chamber. After that, a gallium nitride (GaN) layer disposed under the graphene is etched by injecting oxygen ($O_2$) gas so that a second opening 97 exposing the p-type semiconductor layer 108 is formed.

Next, as shown in FIGS. 1 and 2, the p-type electrode 114 is formed by depositing one of Cr, Au, and TiAu in the second opening 97.

Hereinafter, the method of manufacturing the LED according to another exemplary embodiment of the present invention will be described with reference to FIG. 17, FIG. 6, and FIGS. 13 to 16.

Figure 17:
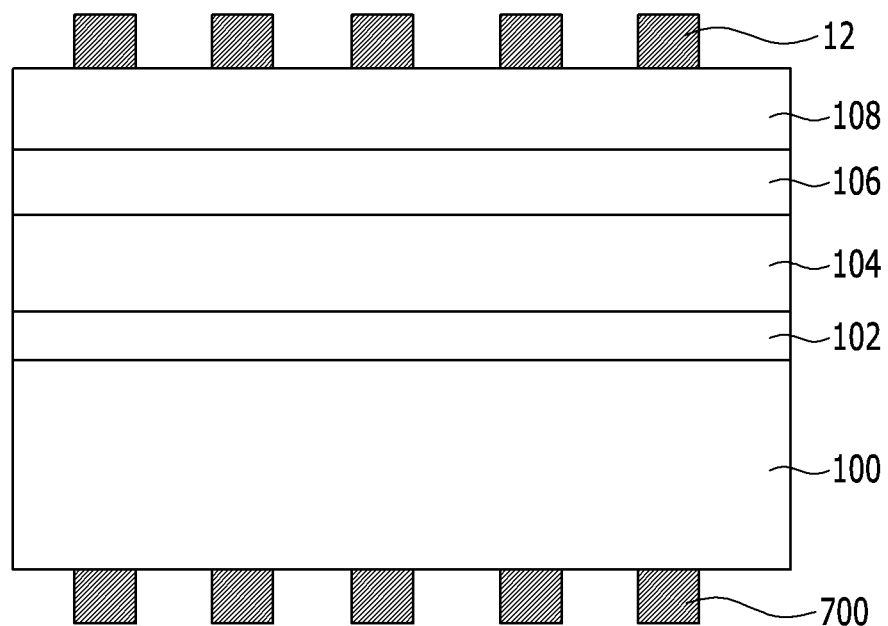
FIG. 17 is a cross-sectional view illustrating a middle step in a method of manufacturing the LED according to another exemplary embodiment of the present invention.

FIG. 17 is a cross-sectional view illustrating a middle step in a method of manufacturing the LED according to another exemplary embodiment of the present invention.

First, as shown in FIG. 6, the buffer layer 102, the n-type semiconductor layer 104, the active layer 106, and the p-type semiconductor layer 108 are sequentially formed on the substrate 100.

Next, as shown in FIG. 17, after an electric field induced pattern 700 is disposed under the substrate 100, the first electrode 12 is formed by the electro-spinning.

The electric field induced pattern 700 has the same plane pattern as that of the first electrode 12 to be formed, and forms an electric field together with a nozzle.

In this manner, if the electric field induced pattern 700 is formed, a spinning solution exhausted from the nozzle is deposited on the substrate 100 along the electric field induced pattern 700 so that the first electrode 12 is formed.

Next, as shown in FIGS. 13 to 16, the second electrode 14, the n-type electrode 112, and the p-type electrode 114 are formed.

In the present invention, if a transparent electrode is formed by a graphene, an LED where transmission efficiency is improved through the entire region of the ultraviolet ray region and the infrared ray region can be provided.

Further, even if crack occurs in an electrode made of the graphene by forming a net electrode, an electric current can be prevented from being blocked due to the net electrode.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of Symbols>

| | |
|---|---|
| 12: first electrode | 14: second electrode |
| 35, 37: opening | 51: first electrode pattern |
| 53: second electrode pattern | 55: third electrode pattern |
| 57: fourth electrode pattern | 59: fifth electrode pattern |
| 65: nozzle | 95, 97: opening |
| 100: substrate | 102: buffer layer |
| 104: n-type semiconductor layer | 106: active layer |
| 108: p-type semiconductor layer | 110: transparent electrode |
| 112: n-type electrode | 114: p-type electrode |
| 110: transparent electrode | 300: first mask |
| 302: second mask | 700: electric field induced pattern |

What is claimed is:

1. A method of manufacturing a light emitting diode, the method comprising:

forming an n-type semiconductor layer on a substrate;
forming an active layer on the n-type semiconductor layer;
forming a p-type semiconductor layer on the active layer;
forming a first electrode by electrospinning after disposing a mask on the p-type semiconductor layer;
forming a second electrode made of graphene on the first electrode after moving the mask;
forming a p-type electrode on the second electrode; and
forming an n-type electrode on the n-type semiconductor layer.

2. The method of claim 1, wherein the forming of the first electrode comprises:

disposing a first mask having a first linear opening pattern;
forming a first conductive pattern of the first electrode by injecting a spinning solution into the first opening pattern;
disposing a second mask having a second linear opening pattern above the first opening pattern; and
forming a second conductive pattern of the first electrode by injecting the spinning solution into the second opening pattern,
wherein the second opening pattern and the first opening pattern are disposed to cross each other.

3. The method of claim 2, wherein the spinning solution has a viscosity in a range of 10 cps to 50 cps.

4. The method of claim 3, wherein the spinning solution comprises metal salt such as copper acetate monohydrate $((CH_3COO)_2Cu)$, titanium tetraisopropoxide $(Ti(OCH(CH_3)_2)_4)$, tin isopropoxide $(Sn(OCH(CH_3)_2)_4)$, and antimony isopropoxide $(C_9H_{21}O_3Sb)$ including metal particles such as zinc (Zn), phosphorus (P), titanium (Ti), tin (Sn), copper (Cu) and antimony (Sb); and a solvent having a viscosity in a range of 10 cps to 50 cps.

5. The method of claim 4, wherein the solvent comprises at least one of diethylene glycol, terpineol, ethylene glycol, diethylene glycol monobenzyl ether, propylene glycol monophenyl ether, glycerol, propylene glycol, and triethylene glycol.

* * * * *